(12) United States Patent
Li et al.

(10) Patent No.: US 10,868,144 B2
(45) Date of Patent: Dec. 15, 2020

(54) METHODS AND SYSTEMS FOR REDUCING DISLOCATION DEFECTS IN HIGH CONCENTRATION EPITAXY PROCESSES

(71) Applicant: Shanghai Huali Microelectronics Corporation, Shanghai (CN)

(72) Inventors: Runling Li, Shanghai (CN); Haifeng Zhou, Shanghai (CN)

(*) Notice: Subject to any disclaimer, the term of this patent is extended or adjusted under 35 U.S.C. 154(b) by 0 days.

(21) Appl. No.: 16/409,876

(22) Filed: May 13, 2019

(65) Prior Publication Data

US 2019/0267472 A1 Aug. 29, 2019

Related U.S. Application Data

(62) Division of application No. 14/879,057, filed on Oct. 8, 2015, now Pat. No. 10,332,979.

(30) Foreign Application Priority Data

Aug. 24, 2015 (CN) .......................... 2015 1 0524163

(51) Int. Cl.
| | |
|---|---|
| *H01L 29/66* | (2006.01) |
| *H01L 29/78* | (2006.01) |
| *H01L 29/165* | (2006.01) |
| *H01L 29/08* | (2006.01) |
| *H01L 21/02* | (2006.01) |

(52) U.S. Cl.
CPC .... *H01L 29/66636* (2013.01); *H01L 21/0243* (2013.01); *H01L 21/0245* (2013.01); *H01L 21/0251* (2013.01); *H01L 21/02447* (2013.01); *H01L 21/02529* (2013.01); *H01L 21/02532* (2013.01); *H01L 29/0847* (2013.01); *H01L 29/165* (2013.01); *H01L 29/7848* (2013.01)

(58) Field of Classification Search
CPC .......... H01L 29/66636; H01L 21/0243; H01L 21/02447; H01L 21/0245; H01L 21/0251; H01L 21/02529; H01L 21/02532; H01L 29/7848; H01L 29/165; H01L 29/0847; H01L 21/20; H01L 21/8238; H01L 27/092; H01L 27/0922; H01L 29/66477; H01L 29/78

See application file for complete search history.

(56) References Cited

U.S. PATENT DOCUMENTS 7,479,422 B2 * 1/2009 Winstead ........ H01L 21/823807
257/E21.43
9,761,719 B2 * 9/2017 Kim .................... H01L 29/7848

* cited by examiner

*Primary Examiner* — Stephen W Smoot
*Assistant Examiner* — Sun Mi Kim King
(74) *Attorney, Agent, or Firm* — Kilpatrick Townsend & Stockton, LLP

(57) ABSTRACT

Semiconductor devices including semiconductor junctions and semiconductor field effect transistors that exploit the straining of semiconductor materials to improve device performance are provided. Also described are methods for making semiconductor structures. Dislocation defect-free epitaxial grown structures that are embedded into a semiconductor base are provided. The epitaxial structures can extend beyond the surface of the semiconductor base and terminate at a faceted structure. The epitaxial structures are formed using a multilayer growth process that provides for continuous transitions between adjacent layers.

10 Claims, 13 Drawing Sheets

METHODS AND SYSTEMS FOR REDUCING DISLOCATION DEFECTS IN HIGH CONCENTRATION EPITAXY PROCESSES

CROSS-REFERENCES TO RELATED APPLICATIONS

The present application is a division of U.S. application Ser. No. 14/879,057, filed Oct. 8, 2015, entitled "METHOD AND SYSTEMS FOR REDUCING DISLOCATION DEFECTS IN HIGH CONCENTRATION EPITAXY PROCESSES", which claims priority to Chinese Patent Application No. 201510524163.4, filed on Aug. 24, 2015, entitled "METHOD AND SYSTEMS FOR REDUCING DISLOCATION DEFECTS IN HIGH CONCENTRATION EPITAXY PROCESSES", which is incorporated by reference herein for all purposes.

BACKGROUND

The present invention is directed to semiconductor processes and devices.

Since the early days when Dr. Jack Kilby at Texas Instruments invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, semiconductor development has generally followed Moore's Law, which roughly states that the number of transistors in a dense integrated circuit doubles approximately every two years. Now, semiconductor processes are pushing toward below 20 nm, and some companies are now working on 14 nm processes. For reference, a silicon atom is about 0.2 nm, which means the distance between two discrete components manufactured by a 20 nm process is just about a hundred silicon atoms.

Manufacturing of semiconductor devices has thus become more and more challenging, pushing toward the boundary of what is physically possible. Huali Microeletronic Corporation™ is one of the leading semiconductor fabrication companies that has focused on the research and development of semiconductor devices and processes.

One of the recent developments in semiconductor technologies has been utilization of silicon germanium (SiGe) in semiconductor manufacturing. For example, SiGe can be used for manufacturing of complementary metal-oxide-semiconductor (CMOS) devices with an adjustable band gap. While conventional techniques exist for SiGe based processes, these techniques are unfortunately inadequate for the reasons provided below. Therefore, improved methods and systems are desired.

SUMMARY

Described herein are semiconductor devices including semiconductor junctions and semiconductor field effect transistors that exploit the straining of semiconductor materials to improve device performance. Also described are methods for making semiconductor structures that are free of or substantially free of dislocation defects. For example dislocation defect-free epitaxial grown structures that are embedded into a semiconductor base are provided. Exemplary epitaxial structures extend beyond the surface of the semiconductor base and terminate at a faceted structure. The epitaxial structures are formed using a multilayer growth process that provides for continuous transitions between adjacent layers.

The epitaxial multilayer structures beneficially lack dislocation defects, making them advantageous for use in 20 nm and sub-20 nm semiconductor fabrication processes where switching speed, leakage current and heat generation need to be finely controlled. In addition, the structures are optionally formed of a binary or compound semiconductor material or semiconductor alloy, such as $Si_{1-x}Ge_x$ or $Si_{1-x}C_x$, allowing the structures to be used in transistor technology employing strained silicon for increasing the electrical and switching performance. Optionally, the concentration of C or Ge is exceptionally high, such as the concentration of C between 0% and 5%, the concentration of Ge greater than 30% or between 30% and 50%, allowing for increased performance from the strained devices when compared to devices including low C or Ge concentrations. In addition, the disclosed devices and methods are compatible with high-k gate dielectrics, providing additional performance advantages.

The multilayer structures are preferentially formed in grooves, channels or recessed regions in a semiconductor base, such as recessed regions having a depth selected between 40.0 nm and 80.0 nm. In one embodiment, the recessed region is a U-shaped groove. For formation of field effect transistor (FET) devices, two multilayer structures are formed in recessed regions that separate a gated channel region. Placing the channel region between the multilayer structures allows for the stress/strain in the channel region to be controlled to allow adjustment of the band-gap and other beneficial performance characteristics.

In a first aspect, the invention provides methods for making a semiconductor structure. Methods of this aspect are useful for forming embedded semiconductor structures to create semiconductor junctions. Methods of this aspect further allow creation of embedded source regions and drain regions in a semiconductor field effect transistor. In a specific embodiment, a method of this aspect comprises providing a semiconductor base layer having a recessed region, epitaxially growing multiple layers of a semiconductor in the recessed region to form a semiconductor multilayer embedded in the semiconductor base layer. In exemplary embodiments, the semiconductor multilayer is free of or substantially free of dislocation defects and includes raised feature, extending above a surface of the semiconductor base layer, that terminates at a faceted structure. In embodiments, providing a semiconductor base layer having a recessed region comprises providing a semiconductor layer and forming the recessed region in the semiconductor layer, such as by removing material from the semiconductor base layer in an etching process. In some embodiments, the recessed region has a feature size less than 20 nm or selected from the range of 0.2 nm to 20 nm.

Optionally, the faceted structure has a facet angle of between 50 and 60 degrees, between 53 and 57 degrees or between 54 and 55 degrees. In a specific embodiment, the facet angle is 54.74 degrees.

In a specific embodiment, epitaxially growing multiple layers of a semiconductor comprises epitaxially growing a first semiconductor layer in the recessed region under a first epitaxial growth condition, epitaxially growing a first semiconductor transition region on the first semiconductor layer under first transitional growth conditions and epitaxially growing a second semiconductor layer on the first semiconductor transition region under a second epitaxial growth condition. In an exemplary embodiment, the first transitional growth conditions provide a continuous transition between the first epitaxial growth condition and the second epitaxial growth condition. For example, in one embodiment, the first semiconductor transition region, formed under the first transitional growth conditions has a varying composition, providing a continuous transition between the composition of the first semiconductor layer and the second semiconductor layer. In a specific embodiment, the first epitaxial growth condition includes a first temperature, pressure and gas concentration. In a specific embodiment, the second epitaxial growth condition includes a second temperature, pressure and gas concentration. In embodiments, the gas concentration condition changes between the first and second epitaxial growth conditions. For example, in one embodiment, a gas that is included in the first epitaxial growth condition is not included in the second epitaxial growth condition. In a further embodiment, a first gas that is included in the first epitaxial growth condition is not included in the second epitaxial growth condition and a second gas that is included in the second epitaxial growth condition is not included in the first epitaxial growth condition, but both the first gas and the second gas are included in the first transitional growth conditions. For example, in order to provide a continuous transition between the first and second epitaxial growth conditions in the previous embodiment, the first transitional growth conditions include the first gas at the beginning of the first transitional growth conditions but not the second gas, while the second gas is included at the end of the first transitional growth condition but not the first gas.

Optionally, epitaxially growing multiple layers of a semiconductor further comprises epitaxially growing a second semiconductor transition region on the second semiconductor layer under second transitional growth conditions, and epitaxially growing a third semiconductor layer on the second semiconductor transition region under a third epitaxial growth condition. In another exemplary embodiment, the second transitional growth conditions provide a continuous transition between the second epitaxial growth condition and the third epitaxial growth condition. For example, in one embodiment, the second semiconductor transition region, formed under the second transitional growth conditions has a varying composition, providing a continuous transition between the composition of the second semiconductor layer and the third semiconductor layer. For some embodiments, the third semiconductor layer comprises the raised feature extending above the surface of the semiconductor base layer that terminates at the first faceted structure.

In some embodiments, epitaxially growing multiple layers of a semiconductor further comprises epitaxially growing an additional semiconductor transition region on the topmost semiconductor layer under additional transitional growth conditions, and epitaxially growing a further semiconductor layer on the additional semiconductor transition region under a further epitaxial growth condition. Optionally, the further semiconductor layer comprises the raised feature extending above the surface of the semiconductor base layer that terminates at the faceted structure.

In various embodiments, the semiconductor base layer comprises silicon or doped silicon. Optionally, each layer in the semiconductor multilayer independently comprises a binary or compound semiconductor material or semiconductor alloy, such as $Si_{1-x}Ge_x$ or $Si_{1-x}C_x$, where $0<x<1$.

In embodiments, the semiconductor structure is a component of a semiconductor junction. In embodiments, the semiconductor structure is a component of a transistor. In a specific embodiment, the semiconductor base layer has two recessed regions and epitaxially growing multiple layers of a semiconductor forms semiconductor multilayers embedded in each of the recessed regions. For example, in embodiments, adjacent semiconductor multilayers embedded in the two recessed regions separate a channel region in the semiconductor base layer, such as where the semiconductor multilayers and the channel region comprise a field effect transistor.

In another aspect, the invention provides semiconductor junctions. In embodiments, a semiconductor junction of this aspect is formed using the methods described herein. In an embodiment of this aspect, a semiconductor junction comprises a semiconductor multilayer embedded in a semiconductor base layer, such as a semiconductor multilayer that is free of or substantially free of dislocation defects and includes a raised feature, extending above a surface of the semiconductor base layer, that terminates at a first faceted structure. Optionally, the faceted structure has a facet angle of between 50 and 60 degrees, between 53 and 57 degrees or between 54 and 55 degrees. In a specific embodiment, the facet angle is 54.74 degrees.

In embodiments, for example, the semiconductor base layer comprises silicon or doped silicon. In some embodiments, the semiconductor multilayer comprises a binary or compound semiconductor material or semiconductor alloy, such as $Si_{1-x}Ge_x$ or $Si_{1-x}C_x$, where $0<x<1$. Optionally, the semiconductor multilayer comprises multiple epitaxially grown layers having different semiconductor concentrations. In embodiments, for example, each epitaxially grown layer is formed under epitaxial growth conditions and the epitaxial growth conditions vary continuously during a transition between epitaxial growth of adjacent layers. Optionally, adjacent epitaxially grown layers are separated by a transition region providing a continuous semiconductor concentration transition between semiconductor concentrations of the adjacent epitaxially grown layers.

In a further aspect, provided are field effect transistors. Field effect transistors of this aspect preferentially exploit the advantageous features described above, such as characteristics useful for improving a switching speed or for providing desirable electrical properties. For example, in one embodiment a field effect transistor comprises a source region embedded in a semiconductor base layer, the source region comprising a first semiconductor multilayer free of or substantially free of dislocation defects, the source region including a first raised feature extending above a surface of the semiconductor base layer and terminating at a first faceted structure, a drain region embedded in the semiconductor base layer, the drain region comprising a second semiconductor multilayer free of or substantially free of dislocation defects, the drain region including a second raised feature extending above the surface of the semiconductor base layer and terminating at a second faceted structure and a channel region positioned between the source region and the drain region, the channel region comprising a strained region of the semiconductor base layer. In an exemplary embodiment, the base layer comprises silicon, doped silicon or a silicon n-well.

Optionally, the first faceted structure, the second faceted structure or both the first faceted structure and the second faceted structure has a facet angle of between 50 and 60 degrees, between 53 and 57 degrees or between 54 and 55 degrees. In a specific embodiment, the facet angle is 54.74 degrees.

Transistors of this aspect are useful for semiconductor devices made at or below the 20 nm processing node. In an embodiment, for example, the source region, the drain region or both the source region and the drain region independently have feature sizes less than 20 nm or selected from the range of 0.2 nm to 20 nm. In an embodiment, for example, the source region, the drain region or both the source region and the drain region independently have feature sizes selected from the range of 2 nm to 15 nm or from the range of 2 nm to 10 nm.

In embodiments, the first semiconductor multilayer and the second semiconductor multilayer each independently comprise a silicon carbide, a silicon germanium alloy, a binary semiconductor or a compound semiconductor. For example, each layer in the semiconductor multilayer independently comprises $Si_{1-x}Ge_x$ or $Si_{1-x}C_x$, where $0<x<1$. In some embodiments, the source and drain regions have identical structures. In other embodiments, the structures source and drain regions are different. For example, each of the source and drain region has independently selectable numbers of layers, concentrations, compositions, etc.

In various embodiments, the first semiconductor multilayer and the second semiconductor multilayer each independently comprise multiple epitaxially grown layers having different semiconductor concentrations. For example, in one embodiment, each epitaxially grown layer is formed under epitaxial growth conditions and wherein the epitaxial growth conditions vary continuously during a transition between epitaxial growth of adjacent layers. These embodiment are useful, for example, for separating adjacent epitaxially grown layers by a transition region providing a continuous semiconductor concentration transition between semiconductor concentrations of the adjacent epitaxially grown layers.

It is to be appreciated that embodiments of the present invention provides numerous advantage over conventional techniques.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by embodiments and optional features, modification and variation of the concepts herein disclosed may be resorted to by those skilled in the art, and that such modifications and variations are considered to be within the scope of this invention as defined by the appended claims. In addition, without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

DETAILED DESCRIPTION

The present invention is directed to integrated circuits. According to various embodiments, different gaseous species are introduced with a smooth transition during epitaxy growth processes, which produces substantially uniform devices. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

Epitaxial growth provides a robust process for forming a variety of crystalline structures, including embedded structures, such as grown in channels, grooves or other recessed features in a semiconductor. Use of SiGe structures embedded in Si allows the surrounding Si material to have significant strain imparted, due to a lattice mismatch between the Si and SiGe. Similarly, SiC structures can also provide a strain to surrounding Si material. In embodiments, embedded $Si_{1-x}Ge_x$ and $Si_{1-x}C_x$ (where 0<x<1) structures and layers can be formed using epitaxial growth. Use of strained silicon in the channel region of MOSFET devices provides advantages for electron and hole mobility, allowing for higher switching speeds.

Multilayered SiGe structures are useful for meeting stress and device requirements and allow for use of high germanium concentrations, such as concentrations greater than 30% or approaching 50%. Techniques for epitaxially growing multilayer SiGe films typically include changing growth conditions between adjacent layers. For example, epitaxial growth of different layers may require different temperature, pressure and gas concentrations.

Figure 1:
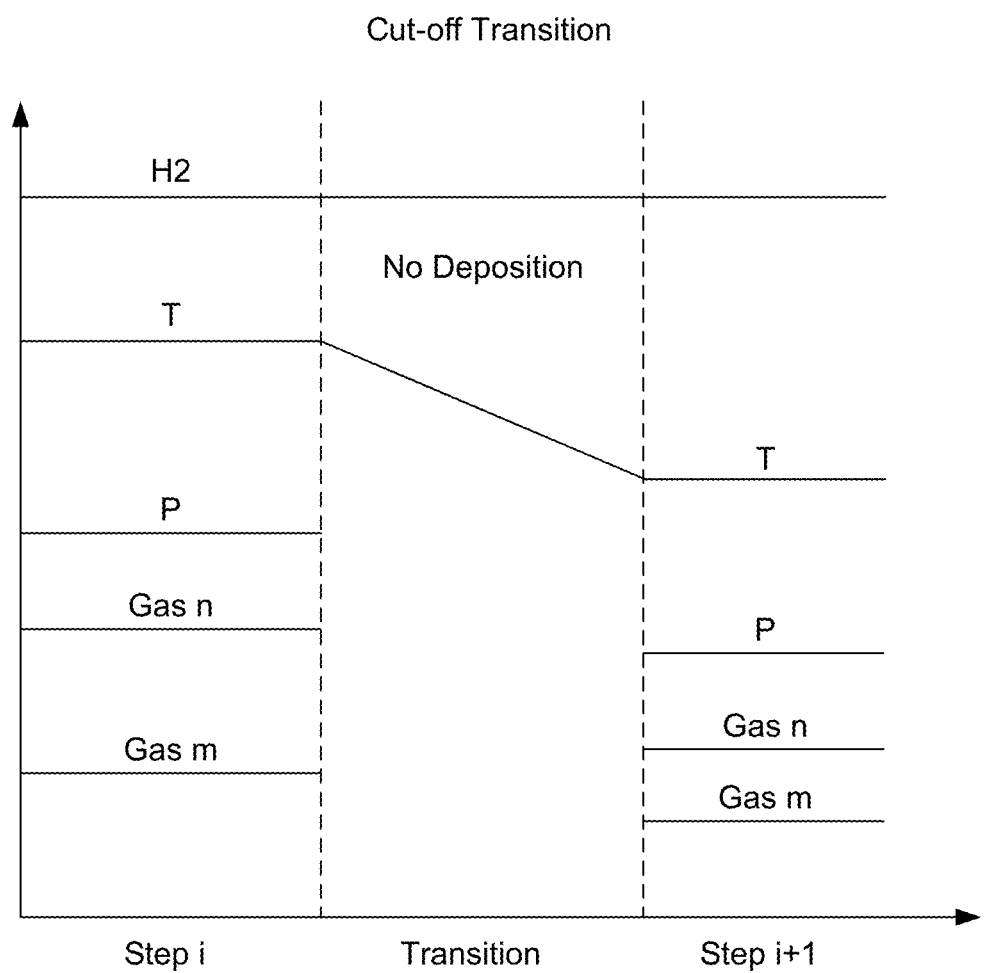
FIG. 1 provides a schematic plot of growth conditions for growing a multilayer semiconductor structure in which no deposition occurs between growing of adjacent layers.

FIG. 1 provides an overview of conventional growth conditions as a function of time for epitaxial growth of two different semiconductor layers. At Step i, temperature, pressure and gas concentrations are established for epitaxial growth of a first layer. For growth of a second layer, different conditions are required, as illustrated at Step i+1. In the embodiment shown, during a transition between steps, deposition/growth is stopped while the temperature is allowed to gradually reduce from the temperature required for Step i to the temperature required for Step i+1. After the temperature reaches the target temperature required for Step i+1, deposition resumes under conditions required for the next layer. Typically, gas n and gas m are purged from the epitaxial chamber during the transition period, and reintroduced at Step i+1. Additionally, other types of gaseous species may be introduced during Step i+1

Such a growth technique where deposition is stopped between adjacent layers is useful for forming multilayer $Si_{1-x}Ge_x$ or $Si_{1-x}C_x$ structures, though the formed structures can suffer from dislocation defects and only limited Si or C concentrations are achievable. Without wishing to be bound by any theory, such a defect is believed to occur where the lattice structures of adjacent layers of different composition are of a significant enough difference that the crystal growth includes a dislocation to accommodate the difference. Preventing the formation of dislocation defects is important for semiconductor logic devices at and below the 40 nm technology node.

Figure 2A:
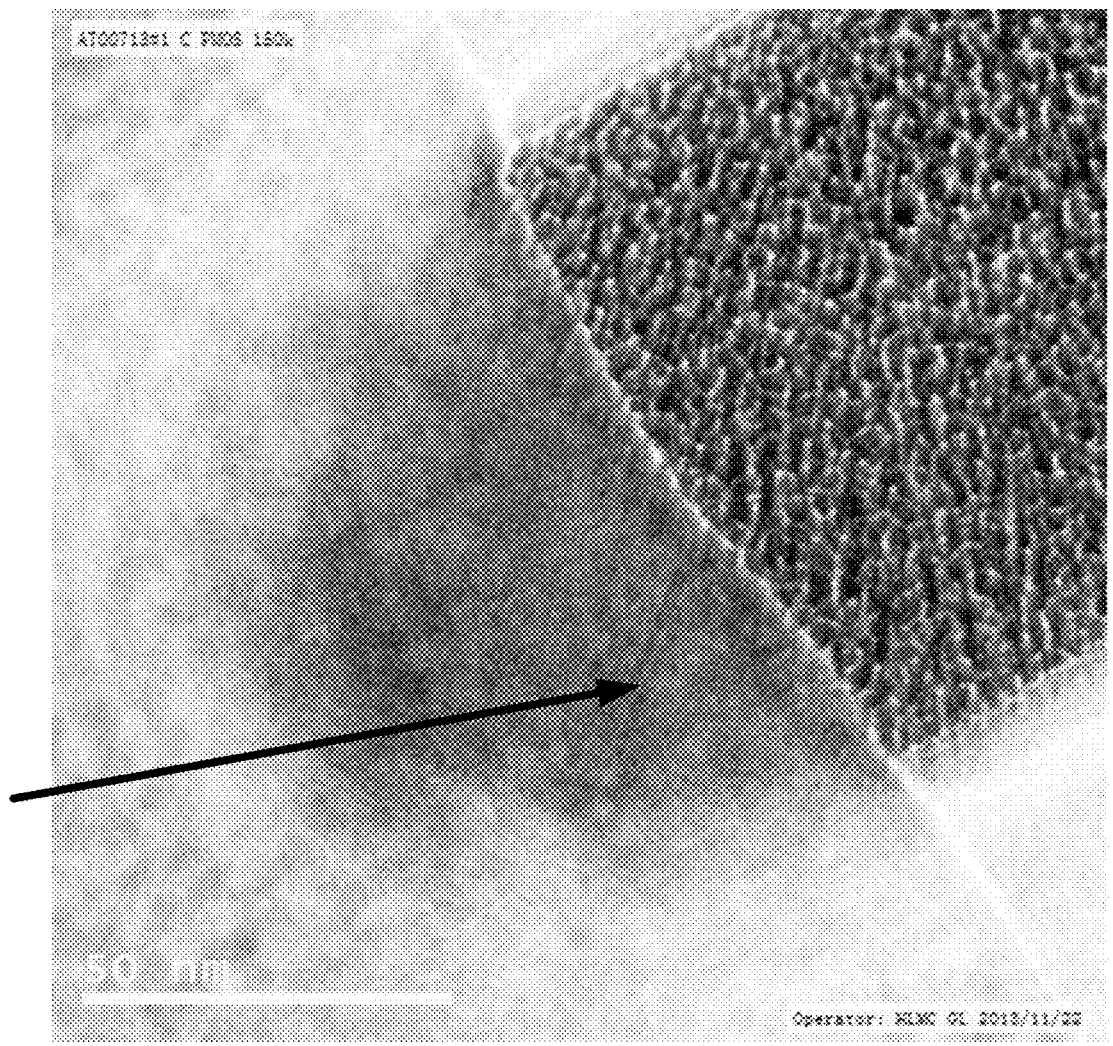
FIG. 2A provides an image of a SiGe embedded structure having a dislocation defect.
Figure 2B:
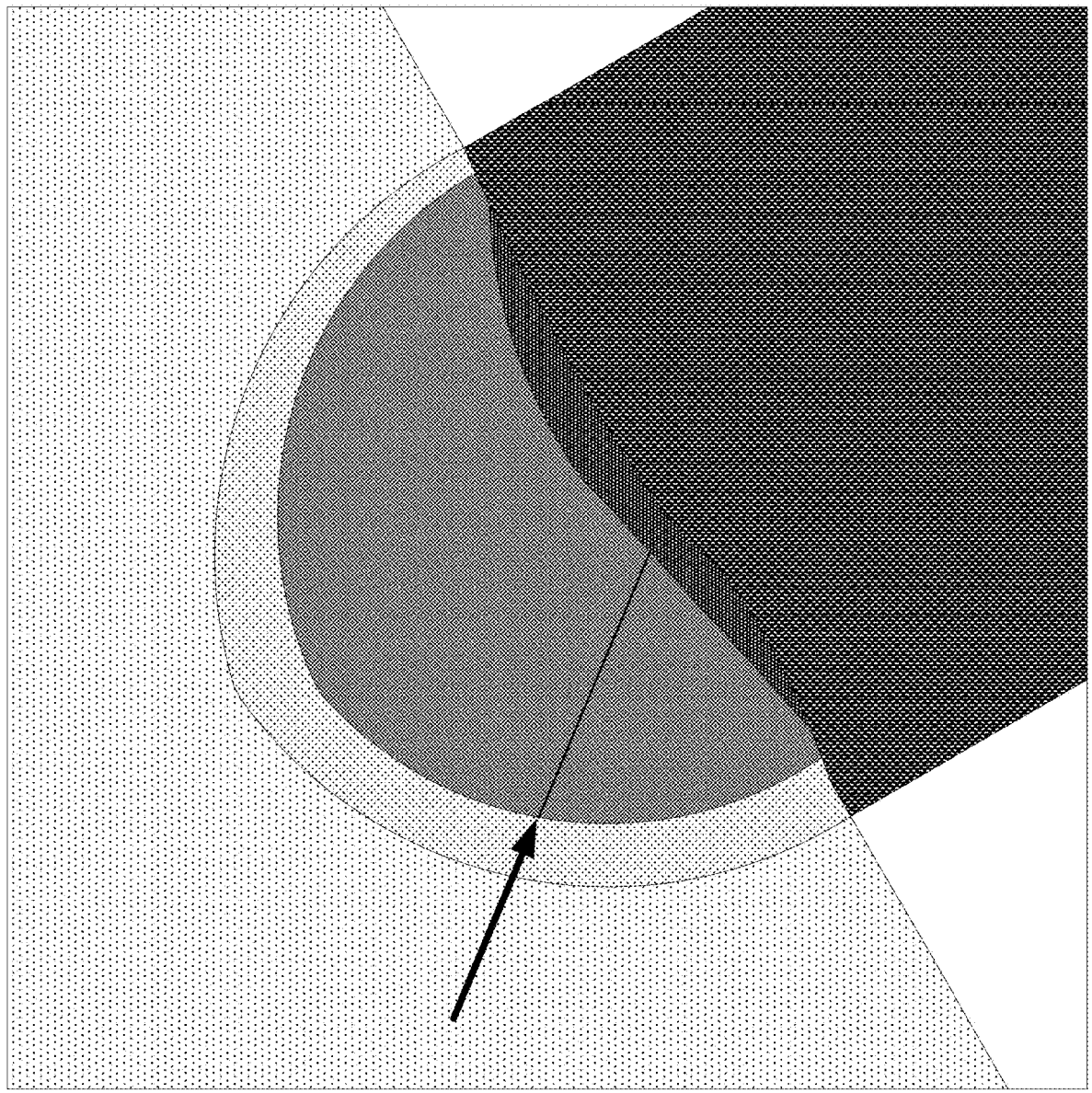
FIG. 2B provides a schematic illustration of FIG. 2A to more clearly illustrate the dislocation defect.

FIG. 2A provides an image of an epitaxial grown embedded multilayer structure including a dislocation defect, highlighted by the arrow. This structure was prepared using a technique analogous to the growth described in FIG. 1, where deposition was stopped during the transition between growth steps. FIG. 2B provides a schematic illustration of FIG. 2A to more clearly show the location and orientation of the dislocation defect.

Figure 3A:
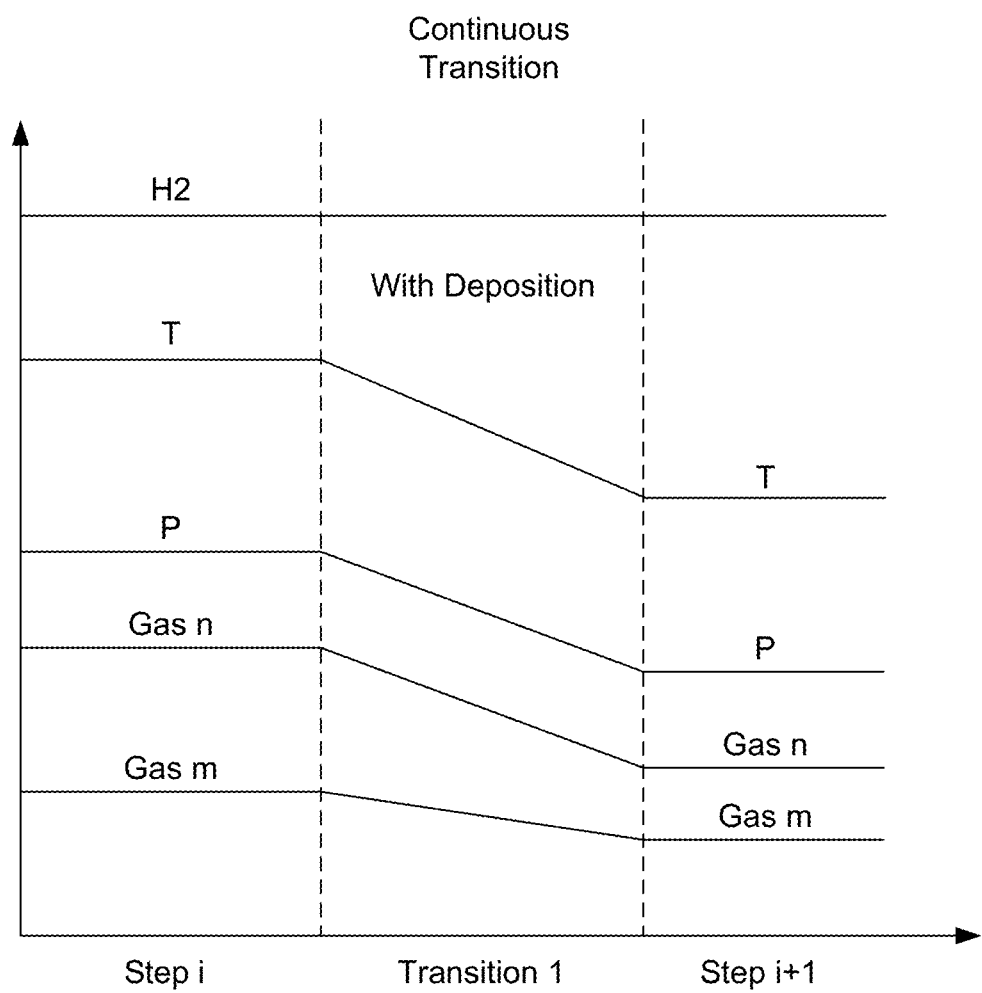
FIG. 3A provides a schematic plot of growth conditions for growing a multilayer semiconductor structure in which deposition continues during a transition between adjacent layers.
Figure 3B:
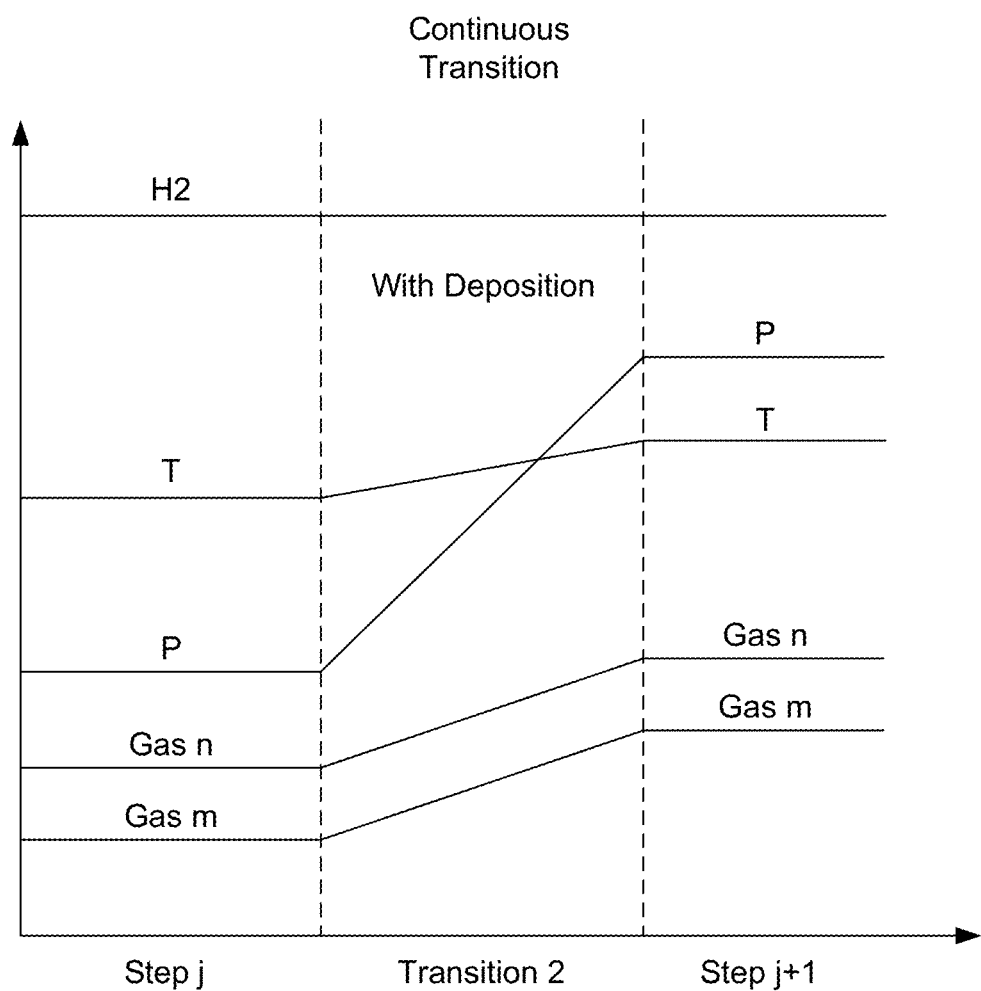
FIG. 3B provides a schematic plot of growth conditions for growing a multilayer semiconductor structure in which deposition continues during a transition between adjacent layers.
Figure 3C:
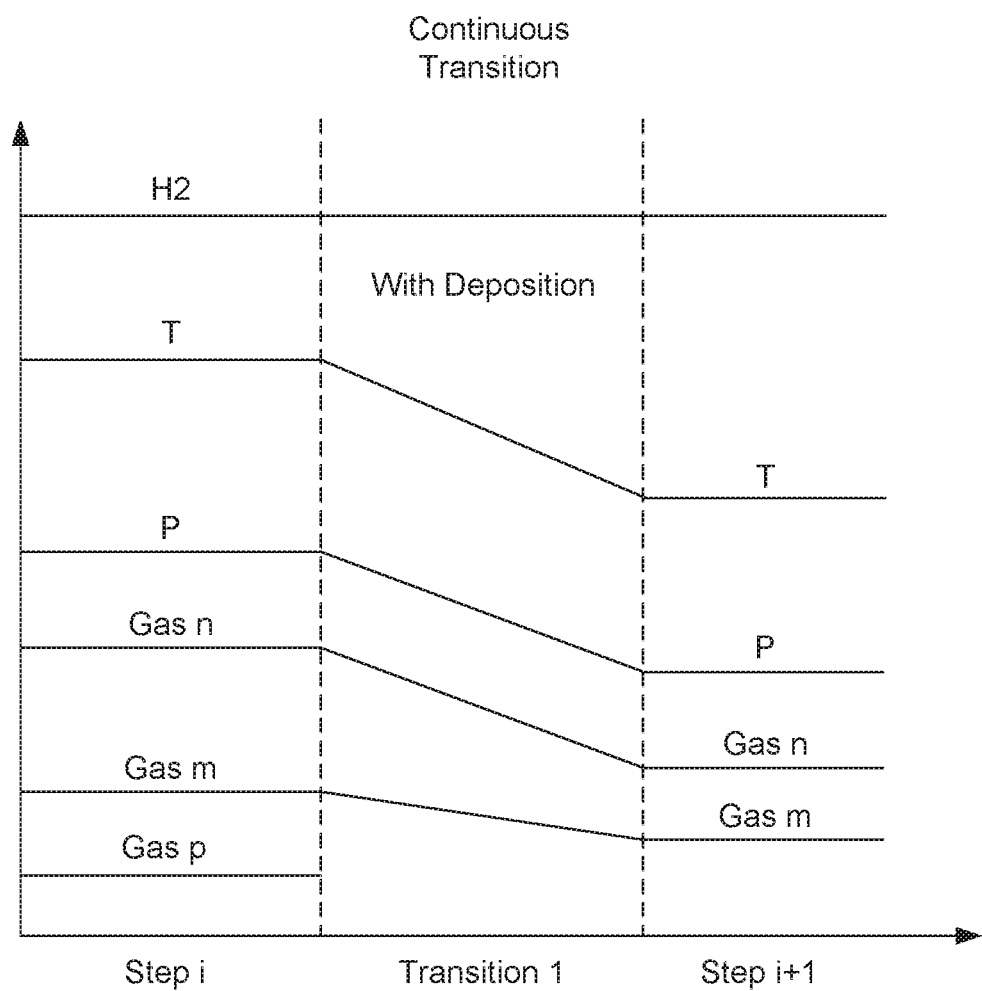
FIG. 3C provides a schematic plot of growth conditions for growing a multilayer semiconductor structure in which deposition continues during a transition between adjacent layers.
Figure 3D:
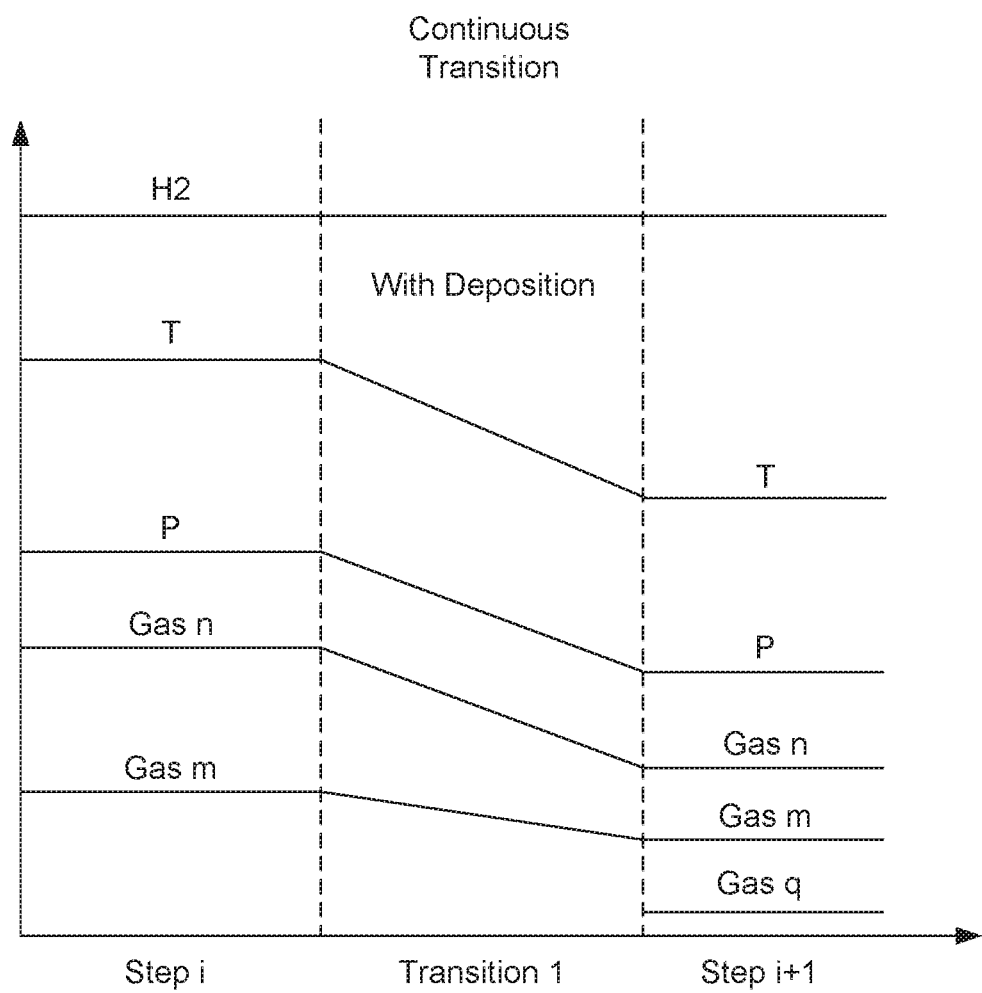
FIG. 3D provides a schematic plot of growth conditions for growing a multilayer semiconductor structure in which deposition continues during a transition between adjacent layers.
Figure 3E:
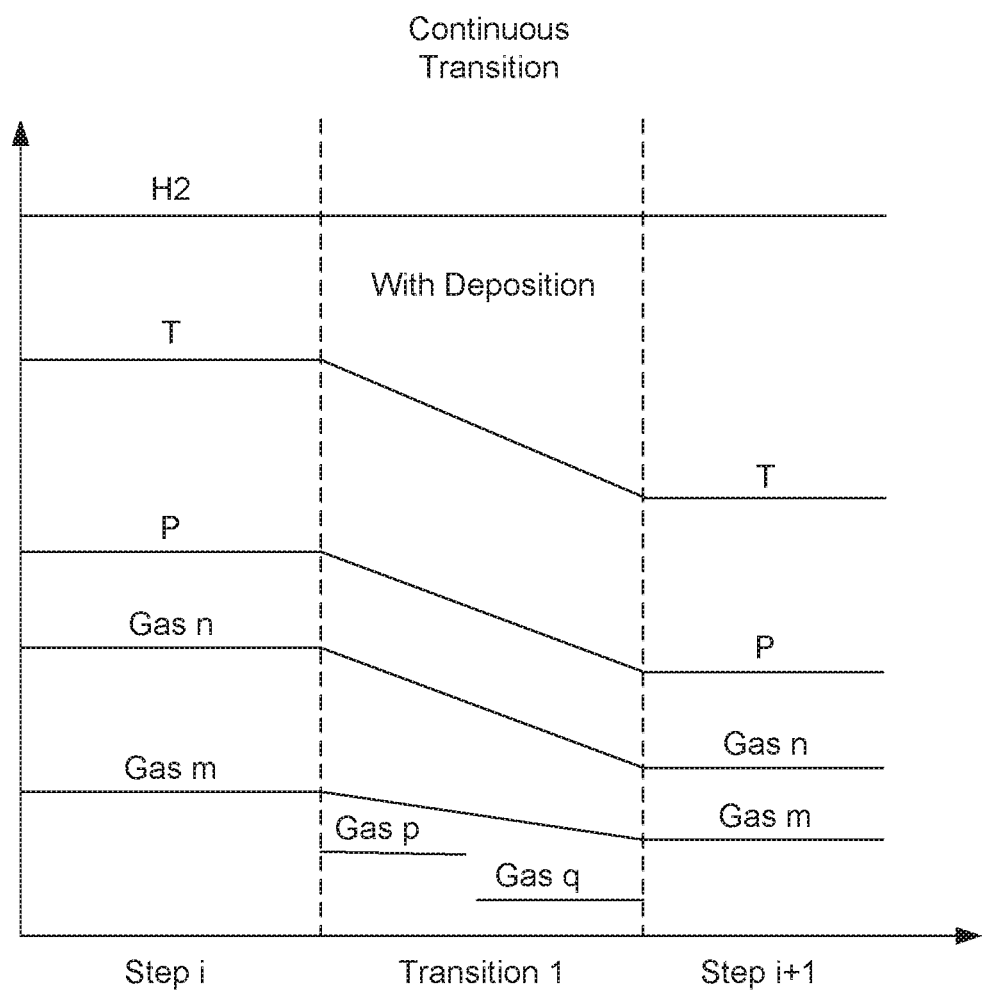
FIG. 3E provides a schematic plot of growth conditions for growing a multilayer semiconductor structure in which deposition continues during a transition between adjacent layers.

FIGS. 3A and 3B provide schematic plots of example deposition conditions for epitaxial growth where the temperature, pressure and gas concentrations are allowed to vary during a transition between steps, with deposition continuing to occur. For example, in FIGS. 3A and 3B, the temperature, pressure and gas concentrations are allowed smoothly vary as a function of time during Transition 1 between Steps i and i+1 and during Transition 2 between Steps j and j+1.

As an example, the epitaxial process shown in FIG. 3A involves lowering the concentration levels of gas n and gas m. Between Step i and Step i+1, gas n and gas m are not purged, but are gradually dropped during the transition step. For example, gas n and gas m are continuously pumped into the epitaxial chamber so their concentrations are maintained at predetermined levels as shown. During the transition step, gas n and gas m are no longer introduced into the epitaxial chamber, but they are not purged or otherwise removed. The concentrations of gas n and gas m gradually drops to a lower level as shown in FIG. 3A, as they are deposited onto the underlying semiconductor device or surfaces of the epitaxial chamber. According to various embodiments, the Transition 1 in FIG. 3A is specifically calibrated to allow gas n and gas m to drop to predetermined concentration target levels. Depending on the application, the change in pressure and temperature may be effected by active cooling the growth chamber and removing gaseous particles from the chamber. In certain embodiments, the chamber temperature is allowed to be cooled over a period of time, and a drop in the gas concentration levels effectively reduces the chamber pressure.

FIG. 3B involves increasing the concentrations of gas n and gas m. Without removing gas n and gas m from the chamber after Step j, additional gas n and gas m are introduced during the transition step, and which ramps up to the concentration levels in Step j+1. As described above, temperature and pressure levels can be adjusted as needed.

It is to be appreciate that the transition processes as illustrated in FIGS. 3A and 3B advantageously allow deposition to continue between steps and provides for a smooth concentration gradient in a transition layer between epitaxial layers having different concentrations. A further benefit achieved by such a technique is the prevention of dislocation defects in the final structure.

In an exemplary embodiment, deposition conditions are selected for the epitaxial growth of the initial layer and the final layer of an embedded semiconductor structure, such as to provide the required strain and electrical properties, with a single continuous transition between the starting and ending conditions. In this way a structure with a single, larger continuous transition can be created, again eliminating the formation of dislocation defects.

Figure 4:
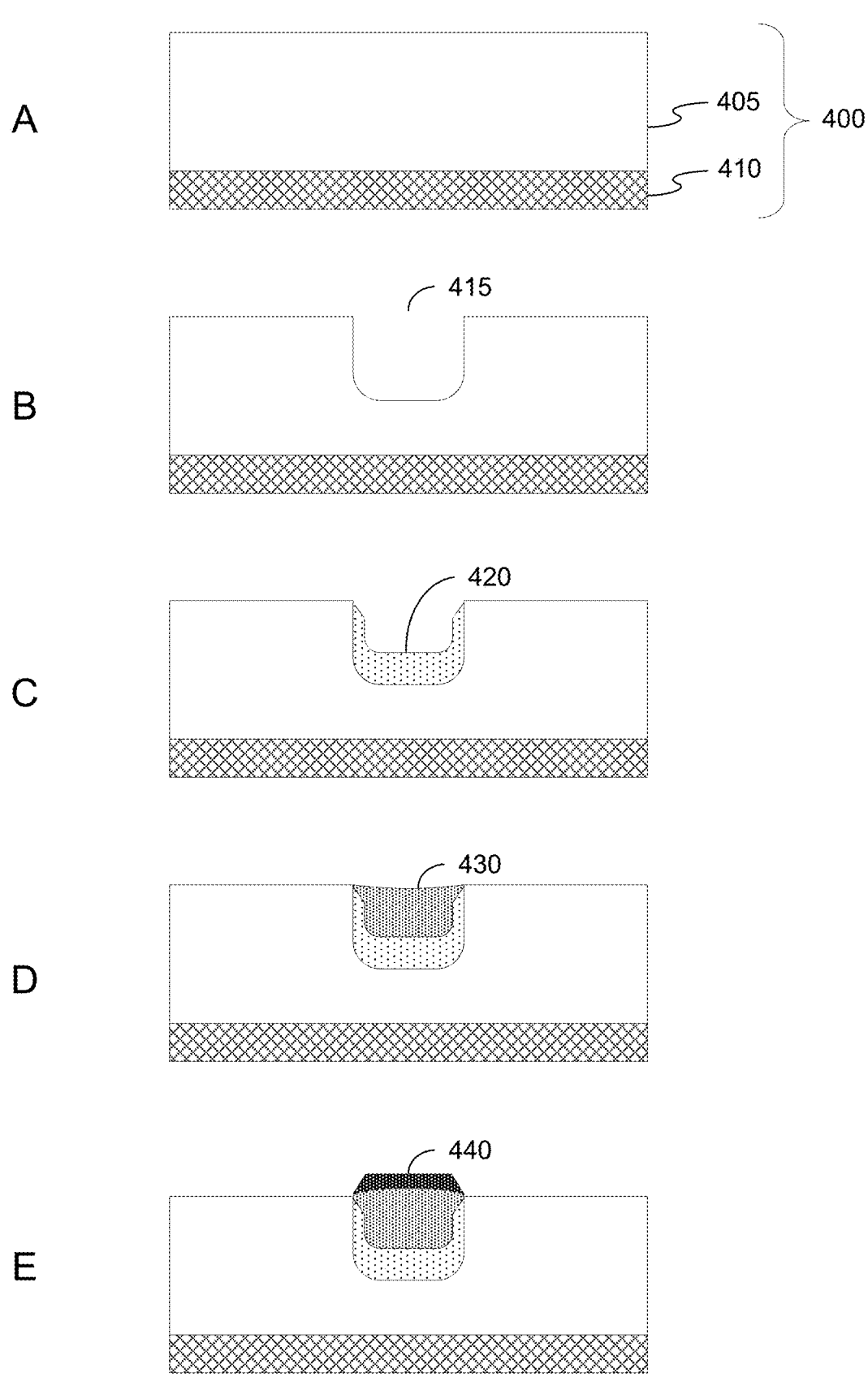
FIG. 4 provides a schematic illustration of a process flow for forming an embedded multilayered semiconductor structure embodiment.

FIG. 4 provides a schematic overview of a process flow for forming an embedded epitaxial multilayer semiconductor structure. In panel A, a semiconductor base 400 is provided, such as a base comprising an N-well 405 in a silicon substrate 410. As shown in panel B, a U-shaped groove 415 is formed in semiconductor base 400. The semiconductor base is then exposed to epitaxial growth deposition conditions for forming a first layer 420 of embedded semiconductor in groove 415, as depicted in panel C. For example, one or more gaseous species are pumped into the epitaxial growth chamber to grow the first layer 420. As an example, the epitaxial growth conditions for forming first layer 420 may correspond to the temperature, pressure and gas concentrations illustrated as Step i of FIG. 3A.

A first transition period follows the growth of first layer 420 to provide a thin first transitional layer, where the epitaxial growth conditions are allowed to vary continuously from the growth conditions for forming first layer 420 and a subsequently grown second layer 430. As an example, the epitaxial growth conditions for the first transitional layer following first layer 420 may correspond to the temperature, pressure and gas concentrations illustrated as the Transition 1 of FIG. 3A, where the temperature, pressure and gas concentrations are allowed to vary continuously from those used during the growth of first layer 420 (Step i) to a subsequently grown second layer (Step i+1). Panel D shows a second layer 430 of semiconductor material epitaxially grown over the first layer 420. For example, without removing the gaseous species that are used for growing the first layer 420, gaseous species for forming the second layer 430 are introduced into the epitaxial growth chamber following the first transition period. The transition from gases for forming layer 420 and to gases for forming layer 430 is a continuous process, which allows these layers to maintain uniformity with a smooth crystal structure transition between. Thus, the first transition layer, which comprises materials from both layers 420 and 430, is formed and positioned between layers 420 and 430.

A second transition period follows the growth of second layer 430 to provide a thin second transitional layer, where the epitaxial growth conditions are allowed to vary continuously from the growth conditions for forming second layer 430 and a subsequently grown third layer 440. As an example, the epitaxial growth conditions for the second transitional layer following second layer 430 may correspond to the temperature, pressure and gas concentrations illustrated as the Transition 2 of FIG. 3B, where the temperature, pressure and gas concentrations are allowed to vary continuously from those used during the growth of third layer 440 (Step j in FIG. 3B) to a subsequently grown third layer (Step j+1 in FIG. 3B). Following the second transition, the third layer 440 of semiconductor material is epitaxially grown over the second layer 430 to form the final embedded structure, as shown in panel E. As depicted in FIG. 4, the third layer 440 terminates in a faceted structure. In various embodiments, SiGe materials of different concentrations comprise the layers of the embedded semiconductor device in FIG. 4. For example, depending on the concentrations and ratios of gaseous species introduced during the epitaxial growth process, SiGe and Si materials may be at different concentration levels in the various layers. It is to be appreciated that other types of materials may be formed using the epitaxial processes.

FIG. 4, as shown, is used to manufacture a CMOS device. But it is understood that FIG. 4 and the description thereof are provided herein as an example. The epitaxial process with a transition from one material to another (or one concentration/ratio to another) can be used for processing other types of semiconductor devices as well.

Figure 5:
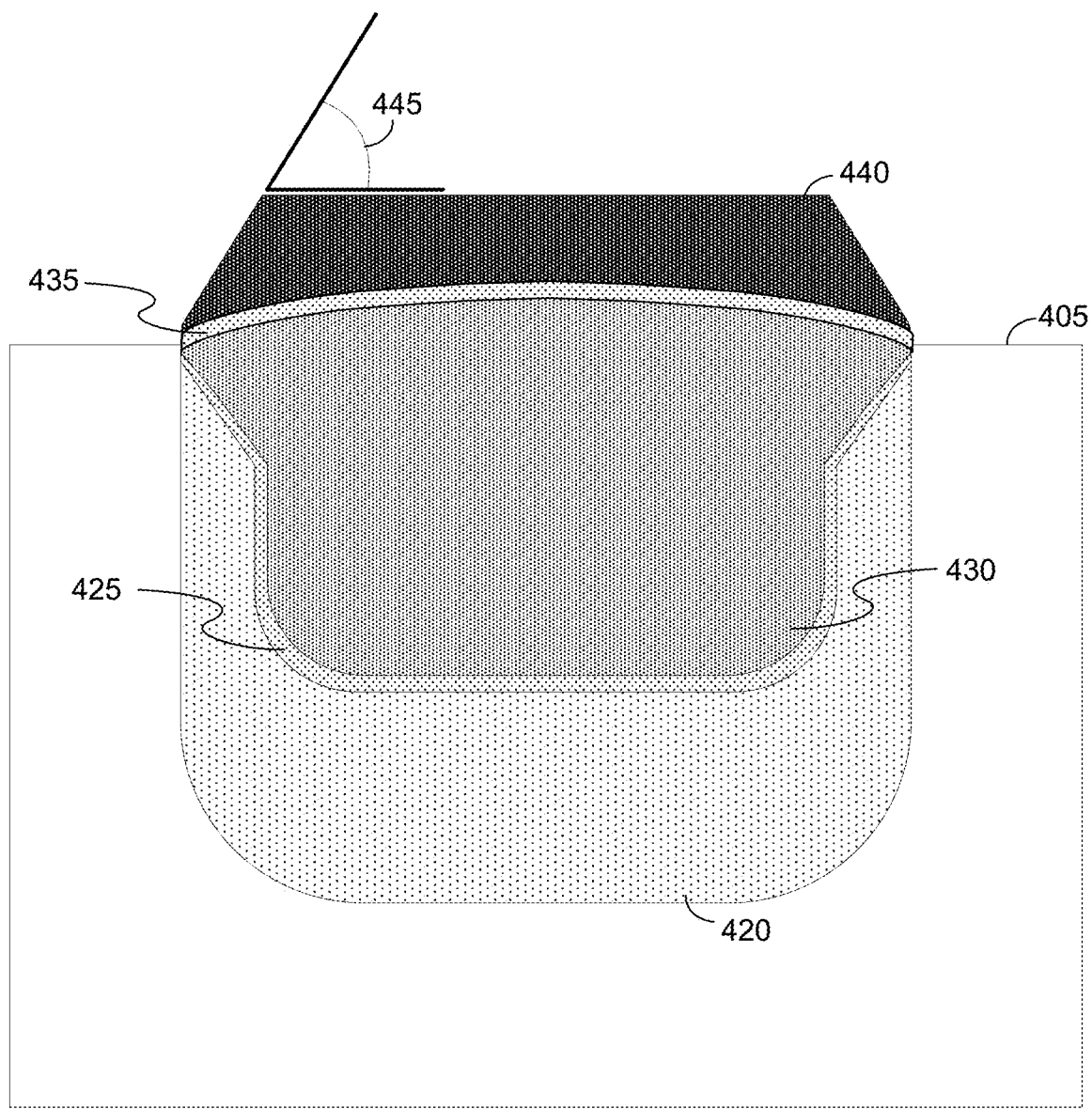
FIG. 5 provides an expanded schematic illustration of an embedded multilayered semiconductor structure embodiment.

FIG. 5 shows an expanded view of the embedded structure depicted in panel E of FIG. 4 and shows a first transition region 425 between first layer 420 and second layer 430. FIG. 5 also shows a second transition region 435 between second layer 430 and third layer 440. Here, first transition region 425 provides for a continuous concentration gradient between the concentrations of first layer 420 and second layer 430. It is to be appreciated that the first transition region 425 is formed as a result of gradually switching from one type of gaseous material to another during the epitaxial processes. By having the transition region 425, the difference between layer 420 and 430 is not abrupt, but buffered. Similarly, second transition region 435 provides for a continuous concentration gradient between the concentrations of second layer 430 and third layer 440. This configuration advantageously minimizes stresses and strains between the first layer 420 and the second layer 430 and between the second layer 430 and third layer 440 and prevents the formation of dislocation defects during the epitaxial growth. It is to be appreciated that by having transition layers, the uniformity of various semiconductor regions is improved compared to conventional structures, and the likelihood of having the type of defects shown in FIG. 2 is reduced.

In addition, FIG. 5 illustrates the faceted structure of the embedded epitaxial multilayer structure, which includes a specific angular configuration of the faces of the terminating surface of the embedded structure. A facet angle 445 is identified in FIG. 5. In various implementations, the facet angle 445 is about 54.74 degrees (+/−1 degree). Without wishing to be bound by any theory, it is believed that the facet angle and structure of the terminating surface of the embedded semiconductor structure is governed by the direction between different crystal planes of the semiconductor. While various facet angles for the faceted structures can be achieved due to the specific composition of the structure, the use of silicon as a base material and significant component of the faceted structure may set bounds on what the facet angle can be. In addition, the faceted structure is a formed structure, achieved during the epitaxial crystal growth, and is not the result of a polishing, planarizing or etching technique. It is to be appreciated that the facet angle 445 as shown is uniquely attributed to having a transitional layer and the process for forming thereof. For example, by having a smooth transition when changing from one material to another (e.g., layer 420 to layer 430), the lattice structure of these layers are maintained and substantially crystalline. The facet angle 445 is associated with the angle of the crystalline structure of the layer 440. For example, in one embodiment, layer 440 comprises SiGe material.

Figure 6:
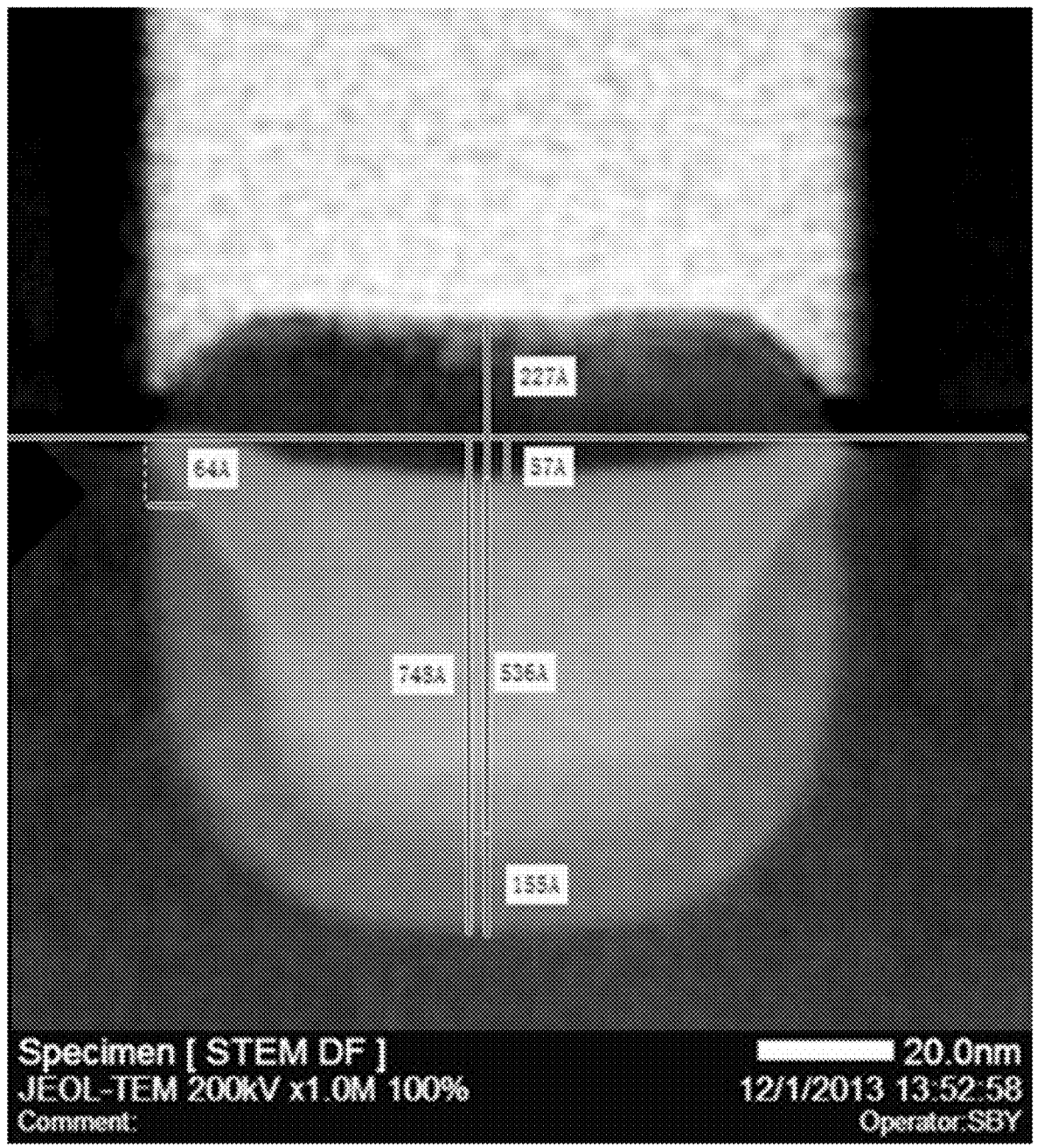
FIG. 6 provides an electron micrograph image of a multilayer semiconductor structure embedded in a semiconductor base.

An embedded SiGe structure was experimentally formed using the techniques described herein, where a multilayer SiGe structure with layers of different germanium concentrations are separated by thin transition regions providing continuous concentration gradients between adjacent layers. FIG. 6 provides an electron micrograph image of an embedded multilayer structure formed using the described methods and illustrates the faceted structure extending above the surface of the semiconductor base material. As shown in FIG. 6, the embedded multilayer structure is free of dislocation defects.

Figure 7:
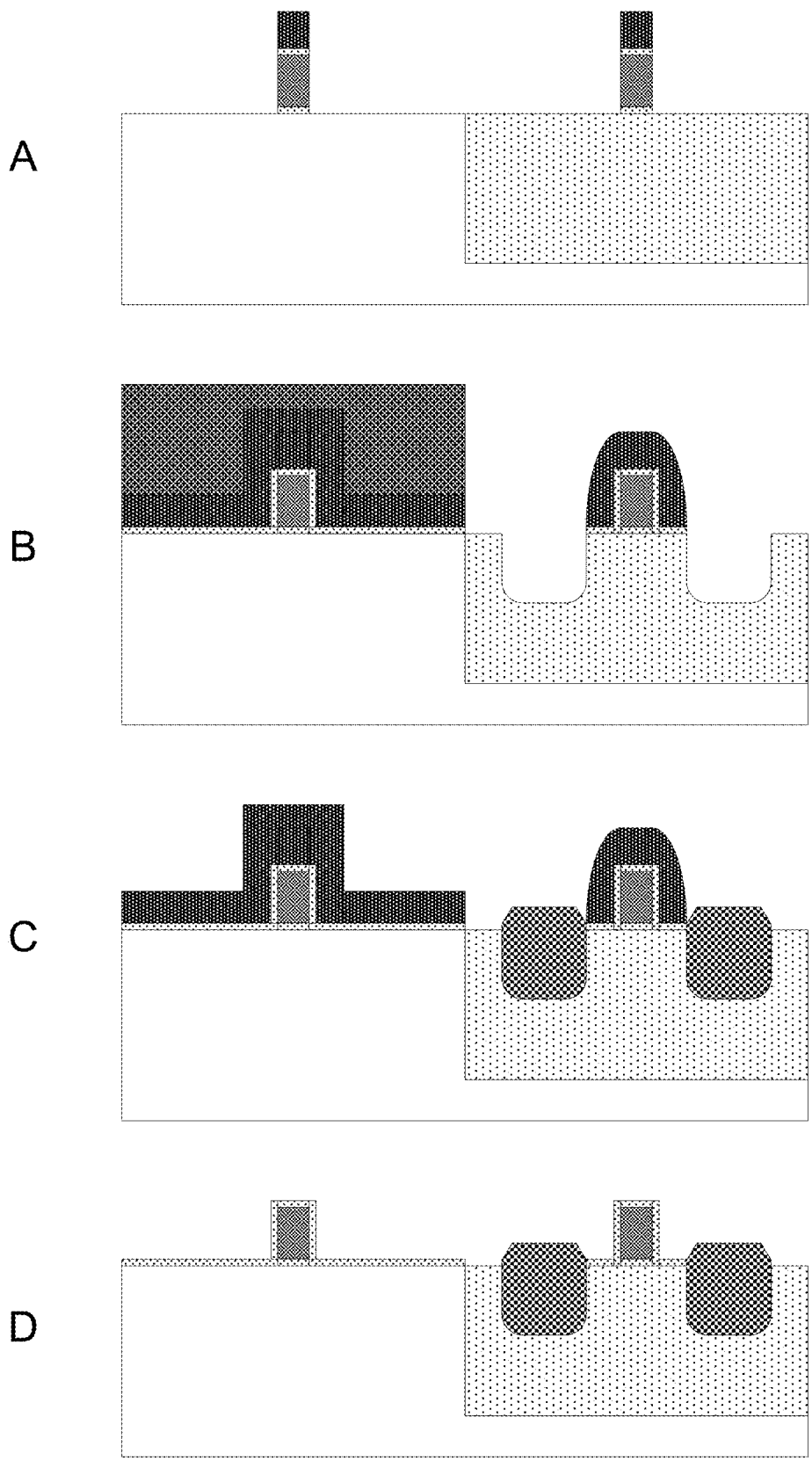
FIG. 7 provides a schematic illustration of a process flow for forming an embedded multilayered semiconductor structure in a field effect transistor.

FIG. 7 provides a schematic overview of a process flow for forming a field effect transistor, where the source and drain regions comprise embedded multilayer epitaxial structures, such as those described above. This configuration is useful, for example, for forming a CMOS transistor structure and one of skill in the art will appreciate the advantages achieved by such a configuration. Initially, a gate film stack is deposited over the surface of the semiconductor base and patterned to define the channel regions between the source and drain regions, as depicted in panel A.

Panel B shows the masking of the NFET structure and PFET gate, such as by a hard mask or other appropriate mask material, to allow patterning and forming the PFET source and drain cavities, such as a U-shaped cavities or other shaped cavities.

Panel C shows the grown PFET $Si_{1-x}Ge_x$ source and drain regions. Here, the source and drain regions are depicted as an embedded material extending above the semiconductor base and terminating at a faceted structure. The source and drain regions are preferably made as multilayer epitaxially formed structures according to the methods described herein, such as by using a first epitaxial growth condition for forming a first layer, first transitional growth conditions for forming a first transitional layer, a second epitaxial growth condition for forming a second layer, second transitional growth conditions for forming a second transitional layer and a third epitaxial growth condition for forming a third layer. Again, this configuration beneficially allows the structures to be free of dislocation defects while imparting a strain to the semiconductor channel region between the source and drain regions for advantageous electrical properties.

Finally, in panel D, the mask materials are be removed and additional processing on the devices can occur, such as preparation of the NFET device or further processes including deposition, etching, masking, lithography, doping, etc.

Figure 8:
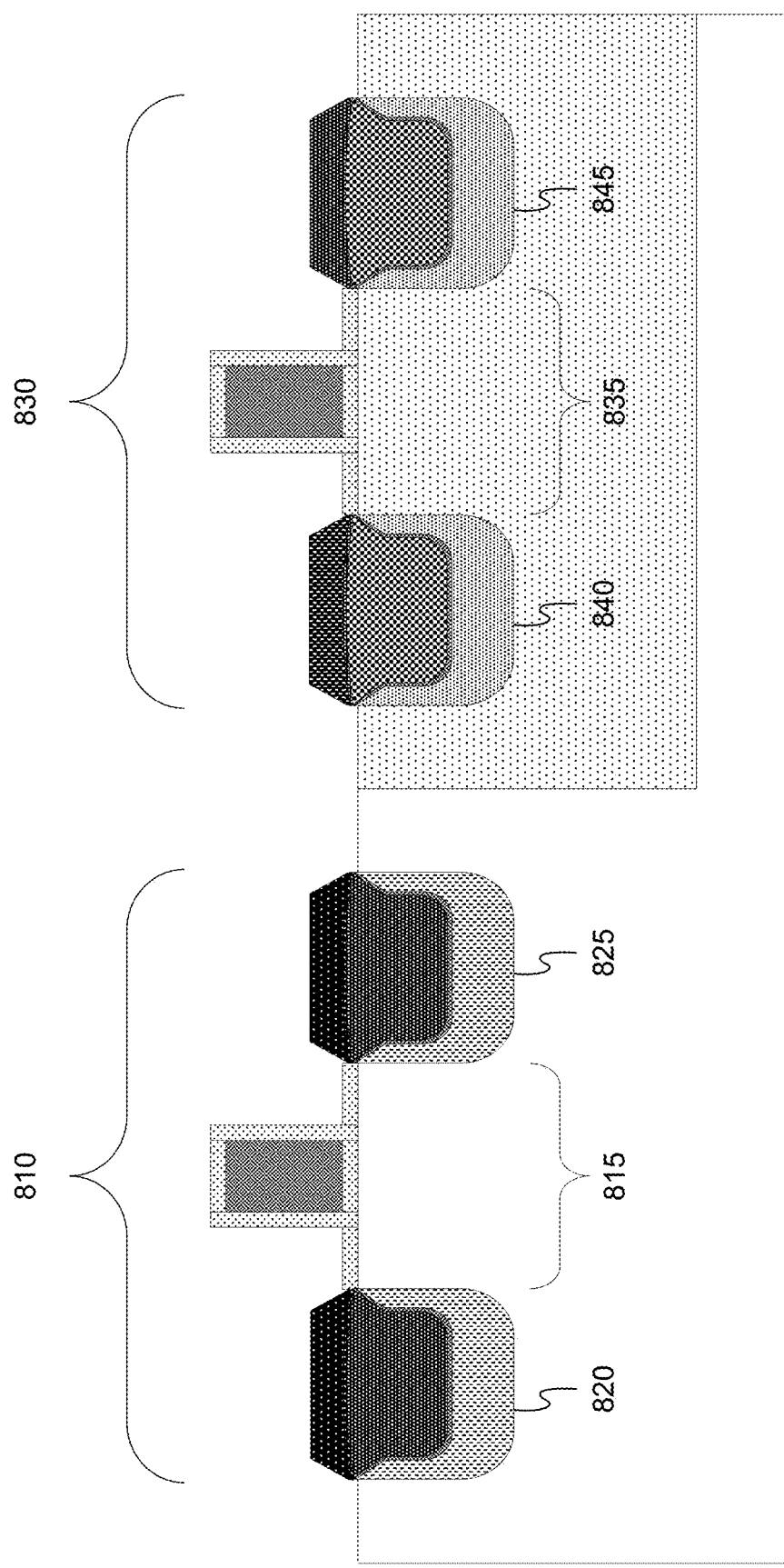
FIG. 8 provides a schematic illustration of a CMOS device with embedded source and drain regions.

FIG. 8 provides a schematic illustration of a CMOS device with embedded source and drain regions, including both a NFET device 810 and a PFET device 830. In NFET device 810, a channel region 815 is positioned between source region 820 and drain region 825. Similarly, in PFET device 830, a channel region 835 is positioned between source region 840 and drain region 845. Each source and drain region is schematically illustrated as a multilayer, such as formed using the multilayer epitaxial growth processes described herein in which a continuous transition between adjacent layers is used to minimize formation of dislocation defects in the crystal structures. In embodiments, the source 820 and drain 825 for NFET device 810 have compositions independent of the compositions of the source 840 and drain 845 for PFET device 830, such as a different dopant concentrations, different semiconductor concentrations, etc. to provide suitable electrical properties for each type of field effect transistor. In exemplary embodiments, channel regions 815 and 835 are provided under stress/strain, imparted due to the proximity of the surrounding source and drain regions and different composition of the source and drain regions from the channel regions, such as a stress/strain level yielding electrical properties desirable for operation of the field effect transistors 810 and 830.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note that, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for making a semiconductor structure, comprising:
   providing a semiconductor base layer having a recessed region;
   epitaxially growing multiple layers of a semiconductor in the recessed region to form a semiconductor multilayer embedded in the semiconductor base layer, wherein the semiconductor multilayer is substantially free of dislocation defects and includes a raised feature, extending above a surface of the semiconductor base layer, that terminates at a faceted structure;
   wherein epitaxially growing multiple layers of a semiconductor comprises:
      epitaxially growing a first semiconductor layer in the recessed region under a first epitaxial growth temperature, pressure and gas concentration condition;
      epitaxially growing a first semiconductor transition region on the first semiconductor layer under first transitional growth temperature, pressure and gas concentration condition; and
      epitaxially growing a second semiconductor layer on the first semiconductor transition region under a second epitaxial growth temperature, pressure and gas concentration condition;
   wherein the first epitaxial growth temperature, pressure and gas concentration condition is different from the second epitaxial growth temperature, pressure and gas concentration condition;
   wherein the first transitional growth condition provides a continuous gradual transition between the first epitaxial growth temperature, pressure and gas concentration condition and the second epitaxial growth temperature, pressure and gas concentration condition.

2. The method of claim 1, wherein epitaxially growing multiple layers of a semiconductor further comprises:
   epitaxially growing a second semiconductor transition region on the second semiconductor layer under second transitional growth temperature, pressure and gas concentration condition; and
   epitaxially growing a third semiconductor layer on the second semiconductor transition region under a third epitaxial growth temperature, pressure and gas concentration condition;
   wherein the second epitaxial growth temperature, pressure and gas concentration condition is different from the third epitaxial growth temperature, pressure and gas concentration condition;
   wherein the second transitional growth condition provides a continuous gradual transition between the second epitaxial growth temperature, pressure and gas concentration condition and the third epitaxial growth temperature, pressure and gas concentration condition.

3. The method of claim 2, wherein the third semiconductor layer comprises the raised feature extending above the surface of the semiconductor base layer that terminates at the faceted structure.

4. The method of claim 1, wherein the semiconductor base layer comprises silicon or doped silicon and wherein each layer in the semiconductor multilayer independently comprises a silicon carbide, a silicon germanium alloy, a binary semiconductor or a compound semiconductor.

5. The method of claim 1, wherein the semiconductor base layer has two recessed regions and wherein epitaxially growing multiple layers of a semiconductor forms semiconductor multilayers embedded in each of the recessed regions.

6. The method of claim 1, wherein adjacent semiconductor multilayers embedded in the two recessed regions separate a channel region in the semiconductor base layer, wherein the semiconductor multilayers and the channel region comprise a field effect transistor.

7. The method of claim 1, wherein the first epitaxial growth temperature, pressure and gas concentration condition includes a first gas that is not included in the second epitaxial growth temperature, pressure and gas concentration condition.

8. The method of claim 7, wherein a second gas included in the second epitaxial growth condition is not included in the first epitaxial growth condition.

9. The method of claim 8, wherein both the first gas and the second gas are included in the first transitional growth condition.

10. The method of claim 9, wherein the first gas but not the second gas is included at the beginning of the first transitional growth condition, and the second gas but not the first gas is included at the end of the first transitional growth condition.

* * * * *